US008198611B2

(12) United States Patent
LaFontaine et al.

(10) Patent No.: US 8,198,611 B2
(45) Date of Patent: Jun. 12, 2012

(54) LASER BEAM FORMATTING MODULE AND METHOD FOR FABRICATING SEMICONDUCTOR DIES USING SAME

(75) Inventors: Bruno M. LaFontaine, Pleasanton, CA (US); Obert Reeves Wood, II, New York, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 880 days.

(21) Appl. No.: 11/732,340

(22) Filed: Apr. 2, 2007

(65) Prior Publication Data

US 2008/0239269 A1      Oct. 2, 2008

(51) Int. Cl.
    *G21K 5/00*      (2006.01)
(52) U.S. Cl. .................................. 250/504 R; 378/119
(58) Field of Classification Search .............. 250/504 R, 250/492.2; 378/34, 119
    See application file for complete search history.

(56) References Cited

U.S. PATENT DOCUMENTS 6,307,913 B1* 10/2001 Foster et al. ..................... 378/34
7,317,196 B2* 1/2008 Partlo et al. ............... 250/504 R

* cited by examiner

*Primary Examiner* — Kiet T Nguyen
(74) *Attorney, Agent, or Firm* — Farjami & Farjami LLP

(57) ABSTRACT

According to one exemplary embodiment, a laser beam formatting module for use in a lithographic system to fabricate a semiconductor wafer comprises an aperture plate having, for example, a circular aperture and capable of being situated between a laser source and a target, and a lens assembly, in a light path between the aperture plate and the target. The laser beam formatting module can produce a substantially uniform laser beam intensity across a target during fabrication of a semiconductor wafer in a laser-produced plasma (LPP) lithographic process using, for example, extreme ultraviolet light (EUV). In one embodiment, a laser beam formatting module improves energy conversion efficiency, reduces out-of-band radiation emission, avoids heating of reflective optics, and eliminates the need for an out-of-band radiation filter.

20 Claims, 5 Drawing Sheets

LASER BEAM FORMATTING MODULE AND METHOD FOR FABRICATING SEMICONDUCTOR DIES USING SAME

TECHNICAL FIELD

The present invention is generally in the field of semiconductor fabrication. More particularly, the invention is in the field of lithographic patterning of semiconductor wafers.

BACKGROUND ART

During semiconductor wafer fabrication, light can be utilized in a lithographic process to enable transfer of very small lithographic patterns, such as nanometer-scale lithographic patterns, from a lithographic mask to a semiconductor wafer. In EUV lithography, for example, a laser-produced plasma (LPP) serves as a lithographic light source, at extreme ultraviolet (EUV) wavelengths. As a result of LPP light source emission, a pattern formed on a lithographic mask can be transferred to a semiconductor wafer by exposing a photoresist formed on the semiconductor wafer to the image of the lithographic mask.

A conventional method for producing LPP light emission in a lithographic system involves use of a focusing lens situated between the laser source and the target to focus the laser beam onto the target, thereby exciting the plasma. Focusing of the laser beam in a conventional method typically produces a distribution of laser beam intensities across the diameter of the target. Because the wavelength of light produced by an LPP light source can vary with the intensity of the laser beam incident on the target, conventional techniques providing a distribution of laser beam intensities at the target may result in the LPP light source emitting light in a distribution of wavelengths. In many situations, however, it is desirable to have an LPP light source provide a substantial portion of its emitted light at a specific wavelength, for example, 13.5 nanometers in an EUV lithographic process. Light that is significantly shorter or longer than the desired wavelength (out-of-band radiation) may not be useful to the lithographic process, and may have the undesirable effect of reducing image quality, and producing excess heat.

SUMMARY

A laser beam formatting module and method for fabricating semiconductor dies using same, substantially as shown in and/or described in connection with at least one of the figures, as set forth more completely in the claims.

DETAILED DESCRIPTION OF THE INVENTION

The present invention is directed to a laser beam formatting module and method for fabricating semiconductor dies using same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
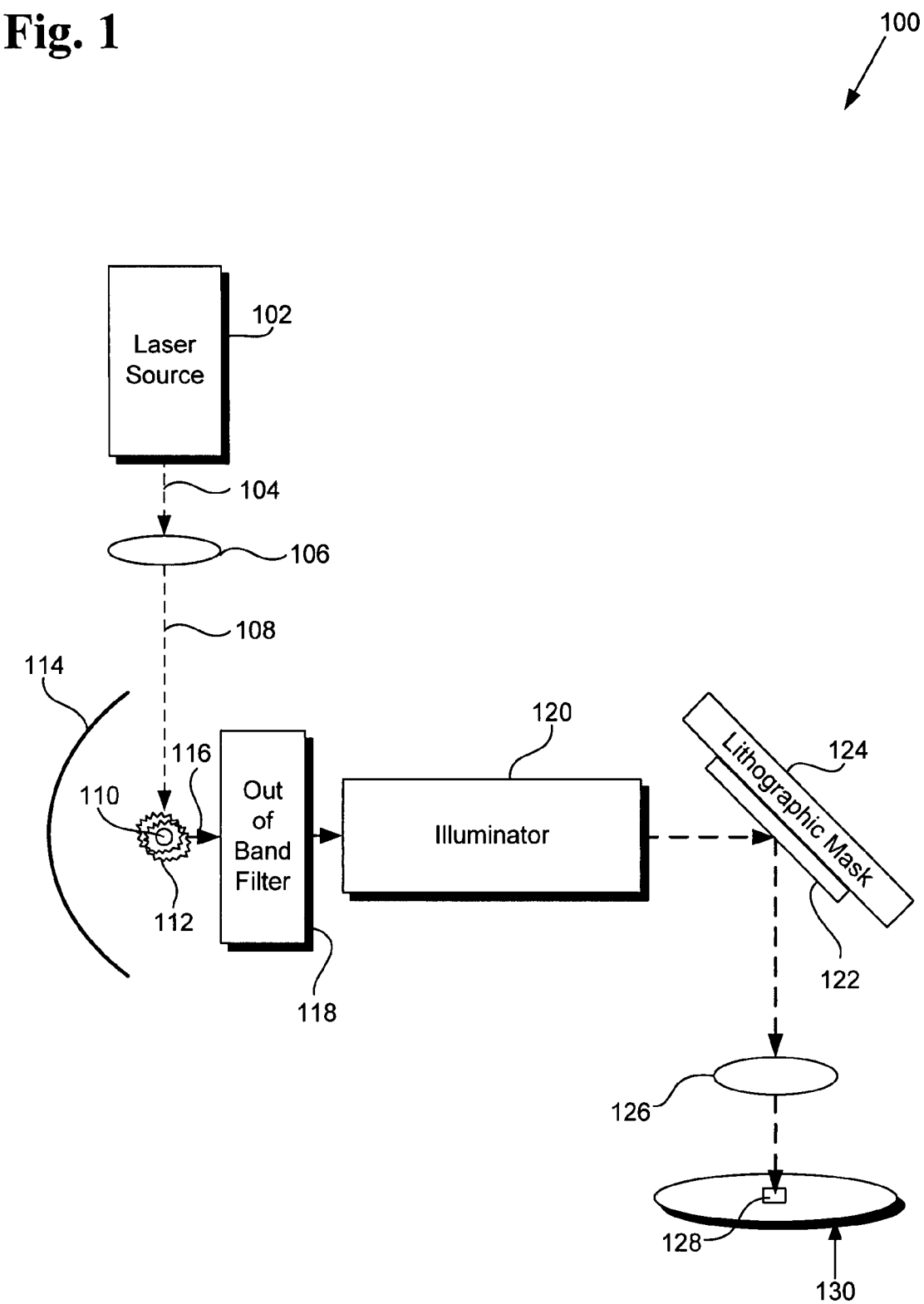
FIG. 1 is a diagram of a conventional lithographic system utilizing an LPP light source.

FIG. 1 illustrates a diagram of a conventional lithographic system utilizing a laser-produced plasma (LPP) light source. FIG. 1 is for the purpose of providing an overview, and elements shown in FIG. 1 are conceptual representation of physical and optical elements, and are thus not intended to show dimensions or relative sizes or scale. Lithographic system 100 includes laser source 102, focusing lens 106, target 110, collector optics 114, out-of-band radiation filter 118, and illuminator 120, in combination with lithographic mask 124 having pattern 122, imaging lens 126, and semiconductor die 128 on semiconductor wafer 130.

In FIG. 1, laser source 102 produces laser beam 104, which passes through focusing lens 106 to emerge as focused laser beam 108. Incidence of focused laser beam 108 on target 110 produces plasma 112, which is the source of patterning radiation in lithographic system 100. Patterning radiation emitted by plasma 112 is collected by collector optics 114 and directed along light path 116 through out-of-band radiation filter 118 and into illuminator 120. Patterning radiation emerging from illuminator 120 is utilized to transfer pattern 122 from lithographic mask 124 through imaging lens 126 to semiconductor die 128, located on semiconductor wafer 130, in a process known in the art.

Patterning radiation may be provided, as in lithographic system 100, through plasma emission resulting from laser beam excitation of a target. In such cases, the wavelength of radiation produced by the plasma may depend on the intensity of the laser beam incident upon the target. Because lithographic patterning of a semiconductor wafer requires light of a particular wavelength corresponding to the type of lithography being performed, for example about 13.5 nanometer wavelength radiation for extreme ultraviolet (EUV) lithography, plasma emission of radiation having wavelength significantly longer or significantly shorter than the wavelength of the patterning radiation sought is undesirable. Consequently, it is advantageous to provide a laser beam of uniform intensity at the target, tuned to an intensity corresponding to plasma emission of patterning radiation at the desired wavelength.

Lithographic systems utilizing laser excited plasmas as sources for patterning radiation typically fail to achieve the advantageous result described above, however, and often produce substantial amounts of radiation having undesirably long or undesirably short wavelengths (out-of-band radiation). A conventional approach to mitigating the effects of out-of-band radiation is shown in FIG. 1, where out-of-band radiation filter 118 is placed in light path 116 prior to its arrival at illuminator 120.

Figure 2:
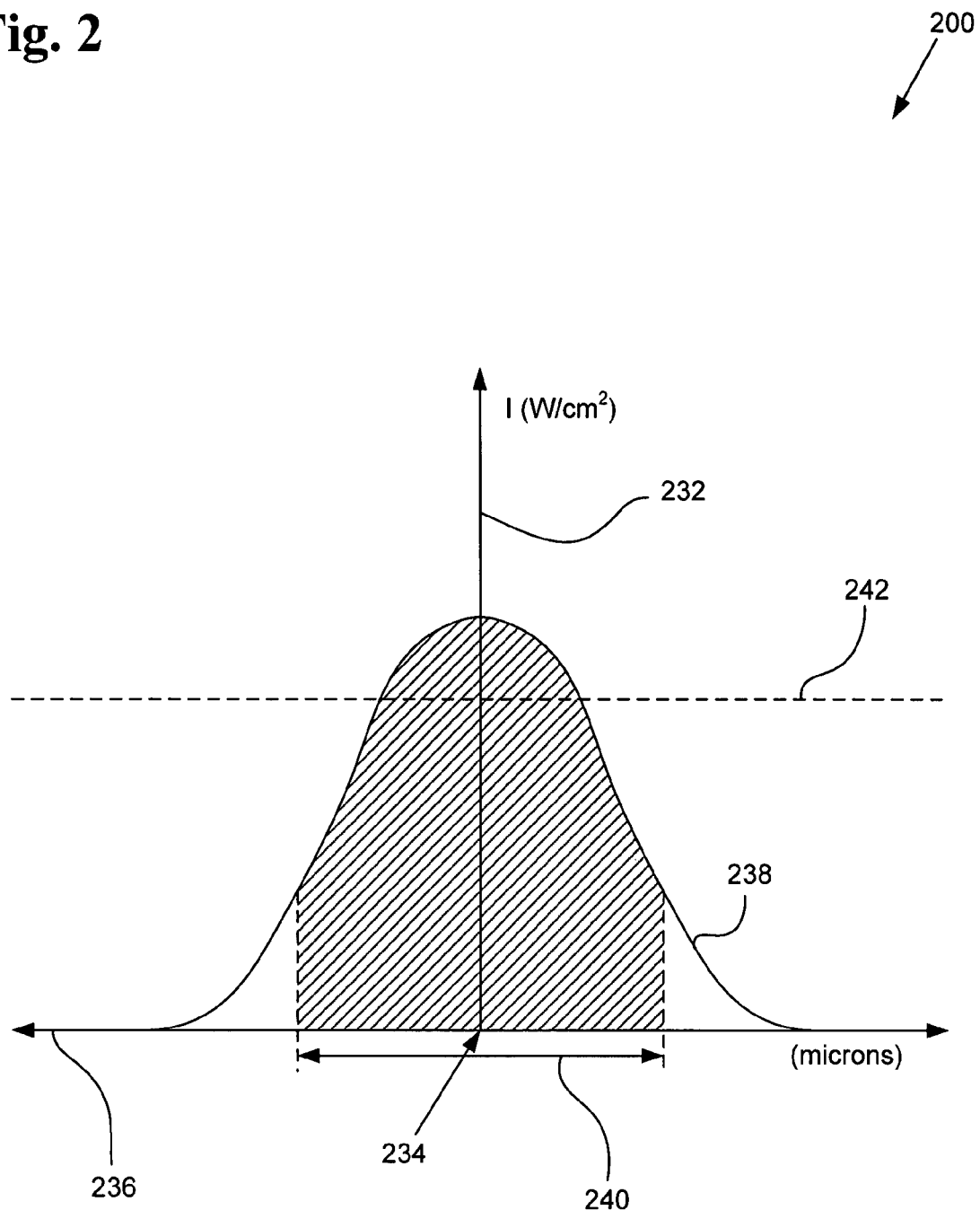
FIG. 2 shows a graph of a conventional laser beam intensity distribution across the diameter of a target.

FIG. 2 shows a graph of a conventional laser beam intensity distribution across the diameter of a target. Graph 200 in FIG. 2 displays laser beam intensity (I) in Watts/cm² on vertical axis 232, and distance from origin 234 in microns, on horizontal axis 236. Curve 238 represents laser beam intensity as a function of lateral distance from the midpoint of a target having target diameter 240, centered at origin 234. Dashed line 242 corresponds to an optimum intensity for producing plasma emission at a desired patterning radiation wavelength.

The intensity distribution across target diameter 240 typically produced in conventional LPP lithographic systems and shown on graph 200 in FIG. 2 results from focusing of the laser beam onto the target. As shown in FIG. 2, the intensity of radiation delivered to a target may vary considerably across its diameter, and corresponds to optimal intensity 242 over only a portion of the target diameter. Other portions of the target are exposed to laser beam intensities that may be significantly greater than or significantly less than optimal intensity 242. Due to the correspondence between incident intensity and emission wavelength described previously, an intensity distribution such as that represented by curve 238 in FIG. 2, corresponds to emission of a distribution of wavelengths, which may include a substantial amount of out-of-band radiation in addition to the patterning radiation desired.

Figure 3:
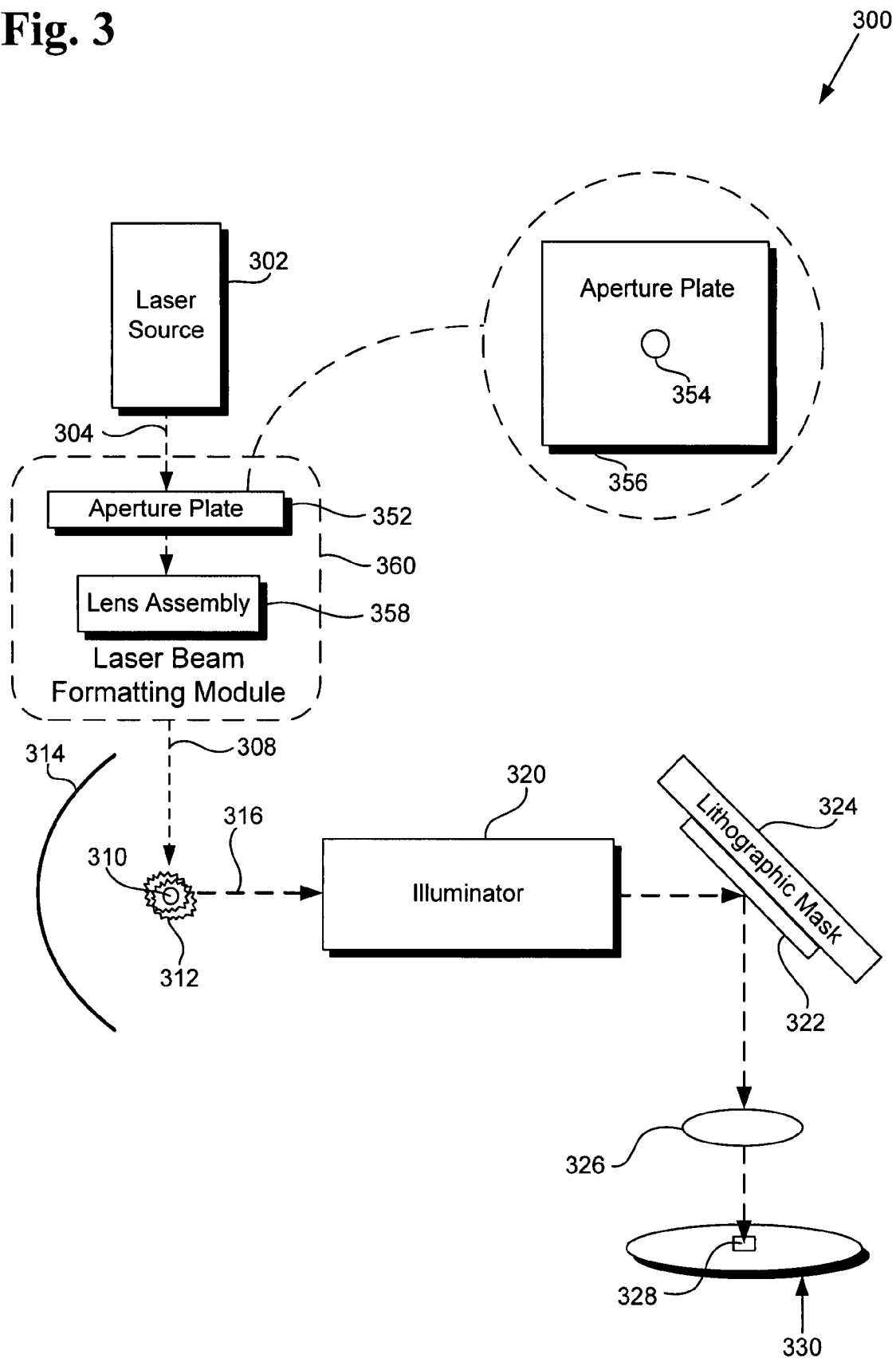
FIG. 3 is a diagram of an exemplary lithographic system utilizing an exemplary laser beam formatting module, in accordance with one embodiment of the present invention.

FIG. 3 illustrates a diagram of an exemplary lithographic system utilizing an exemplary laser beam formatting module, in accordance with one embodiment of the present invention. Lithographic system 300 includes laser source 302, target 310, collector optics 314, and illuminator 320, in combination with lithographic mask 324 having pattern 322, imaging lens 326, and semiconductor die 328 on semiconductor wafer 330. Those recited elements correspond respectively to laser source 102, target 110, collector optics 114, illuminator 120, lithographic mask 124 having pattern 122, imaging lens 126, and semiconductor die 128 on semiconductor wafer 130, in lithographic system 100 of FIG. 1. Moreover, laser source 302 produces laser beam 304, which stimulates emission from plasma 312 that is directed along light path 316, corresponding to laser beam 104, plasma 112, and light path 116 in FIG. 1.

Absent in FIG. 3 is out-of-band radiation filter 118 utilized in lithographic system 100 to mitigate the undesirable effects of out-of-band radiation emission by plasma 112 in FIG. 1. FIG. 3 also includes one embodiment of the invention's laser beam formatting module 360, comprising aperture plate 352 and lens assembly 358. Laser beam formatting module 360 replaces focusing lens 106 in FIG. 1. It is noted that lithographic system 300 may contain additional elements, which are not shown in FIG. 3 for purposes of brevity and simplicity of illustration. Moreover, aperture plate 352 is merely an example of one or more optical elements that can be placed between laser source 302 and lens assembly 358. In other embodiments, a diffractive optical element can in general replace aperture plate 352. Thus, lens assembly 358 can be in a light path between one or more optical elements, for example a diffractive optical element or an aperture plate (such as aperture plate 352), and target 310.

In FIG. 3, laser source 302 produces laser beam 304, which passes through laser beam formatting module 360 to emerge as formatted laser beam 308. Incidence of formatted laser beam 308 on target 310 produces plasma 312, which is the source of patterning radiation in lithographic system 300. Unlike conventional approaches to stimulating plasma emission of patterning radiation, implementation of the embodiment in FIG. 3 formats the laser beam and provides a substantially uniform laser beam intensity across target 310, resulting in significantly reduced emission of out-of-band radiation compared to conventional laser beam focusing techniques.

Laser beam formatting module 360 accomplishes this in a multi-stage process involving laser beam shaping and laser beam demagnification. As shown in FIG. 3, laser beam 304 enters laser beam formatting module 360 and encounters aperture plate 352 having laser facing surface 356 and containing aperture 354. Aperture 354 may be shaped to correspond precisely or approximately to the shape of target 310. For example, typical targets used in LPP emission of EUV are approximately spherical droplets presenting a substantially circular cross section. In that instance, aperture 354 may be a circular shape as shown in FIG. 3.

After passing through aperture plate 352, a laser beam is demagnified by passage through lens assembly 358. Demagnification preserves the shape imposed on the laser beam by aperture plate 352, as well as the uniformity of the beam intensity, while shrinking the dimensions of the shape to approximately the dimensions of the target. Thus after passage through laser beam formatting module 360, formatted laser beam 308 displays a uniformity in intensity similar to laser beam 304, but has been shaped and demagnified to approximately the shape and diameter of target 310.

Figure 4:
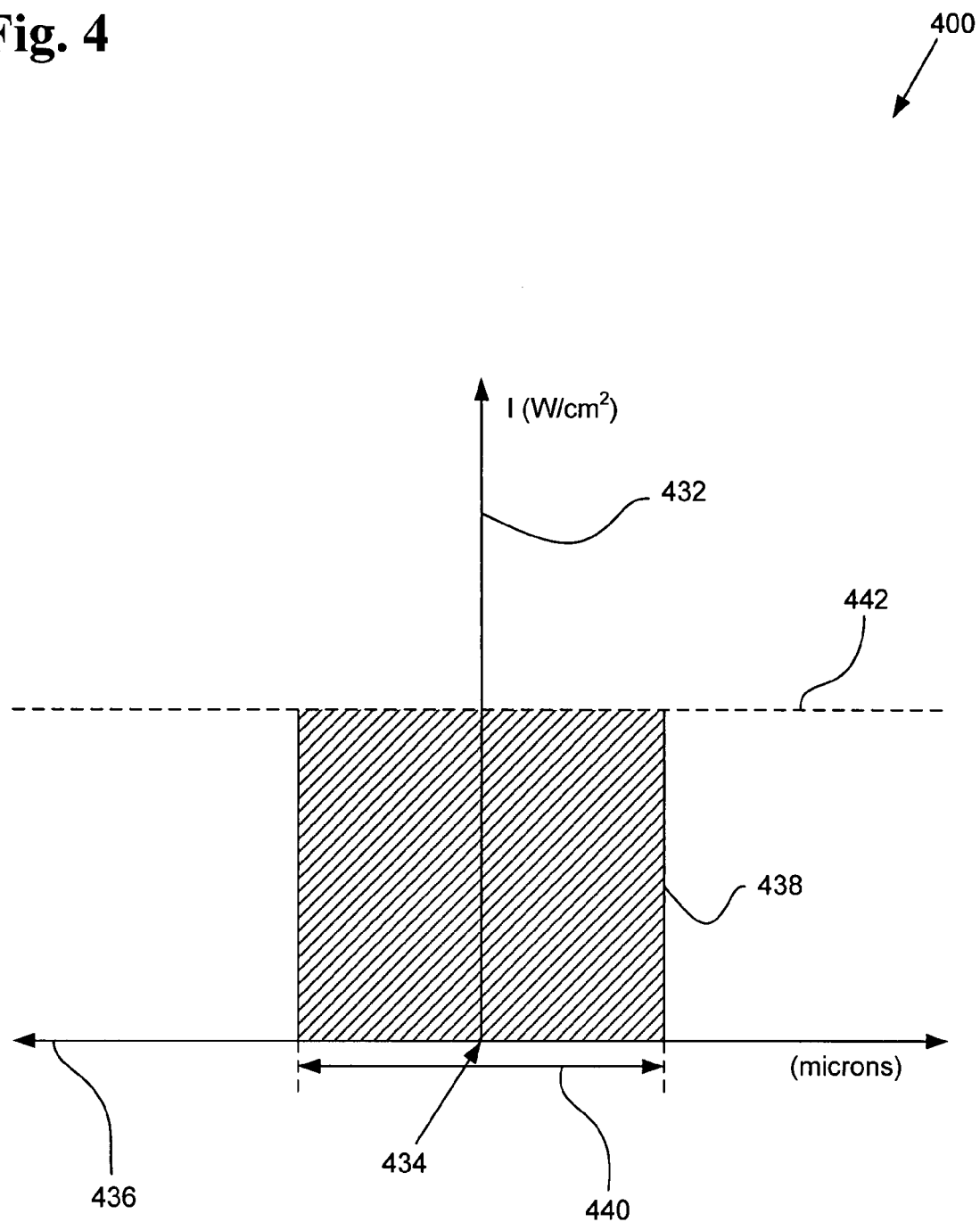
FIG. 4 shows a graph of an exemplary laser beam intensity distribution across the diameter of a target, in accordance with one embodiment of the present invention.

The result of implementing the present embodiment may be seen in FIG. 4. FIG. 4 shows a graph of an exemplary laser beam intensity distribution across the diameter of a target, in accordance with one embodiment of the present invention. Graph 400 in FIG. 4 displays laser beam intensity (I) in Watts/cm$^2$ on vertical axis 432, and distance from origin 434 in microns, on horizontal axis 436, corresponding respectively to similarly scaled vertical axis 232 and similarly scaled horizontal axis 236 in FIG. 2. Flat topped curve 438 represents laser beam intensity as a function of lateral distance from the midpoint of a target having target diameter 440, centered at origin 434, corresponding to curve 238 on graph 200 in FIG. 2. Moreover, dashed line 442 corresponds to an optimum intensity for producing plasma emission at a desired patterning radiation wavelength, and corresponds to optimum intensity 242 in FIG. 2.

Target diameter 440 and optimum intensity 442, as shown on graph 400, may vary, depending on the composition of the target, and the wavelength of patterning radiation sought. For example, in a typical lithographic system utilizing a laser to excite plasma EUV emission, a target may be an approximately spherical droplet having a diameter in the range of approximately ten microns to approximately five hundred microns. In one exemplary system utilizing a laser to excite EUV emission, a target might be a droplet of a salt solution doped with tin (SN), for example, having target diameter 440 of approximately thirty microns, for example. In the exemplary circumstances described, a typical optimum intensity could be approximately $1.5 \times 10^{11}$ W/cm$^2$, but in other embodiments an intensity of less than or greater than approximately $1.5 \times 10^{11}$ W/cm$^2$ can also be utilized.

As shown in FIG. 4, the laser beam intensity delivered to the target is uniform over the target diameter, and uniformly optimized to produce emission of patterning radiation at the desired frequency. Also shown in FIG. 4 is the increased precision with which laser beam intensity is delivered to the target. It is worth noting from flat topped curve 438 on graph 400 that, according to the present embodiment, laser beam intensity is substantially zero beyond the target's edges, and substantially optimal across its diameter. By contrast, curve 238 on graph 200 shows laser intensity delivered to a region beyond the target's edges in a conventional laser beam focusing approach, i.e. wasted laser beam intensity, as well as delivery of variable laser beam intensity across target diameter 240.

Implementation of the present embodiment of the invention's laser beam formatting module provides numerous advantages, which include improvement in the efficiency of conversion of incident laser beam energy to production of patterning radiation, and significant reduction in emission of out-of-band radiation. In other words, for a given energy density delivered to a target by a laser beam, more of that energy may be converted to productive patterning radiation using the present invention's laser beam formatting module than is typically the case when conventional laser beam focusing techniques are utilized. Additionally, for a given energy density delivered to a target by a laser beam, significantly less of that energy is wasted, or converted into undesirable out-of-band radiation, through use of the present invention.

Reduction of out-of-band radiation emission is advantageous for several reasons. Out-of-band radiation having a wavelength longer than the desired patterning radiation may be difficult to screen out of the lithographic process, resulting in out-of-band radiation filters being less than optimally effective. Where such a filter is not in use, or fails to block the out-of-band wavelengths, propagation through the lithographic system of radiation having wavelength longer than the patterning radiation can blur the image transferred from a lithographic mask to a semiconductor die, thereby degrading image quality. Even where image quality is not affected, out-of-band radiation of both undesirably long and undesirably short wavelengths can generate heat in the reflective optical components, including the collector optics and constituent elements of the illuminator. Heating may result because optical surfaces that are precisely engineered to reflect a desired patterning radiation wavelength can absorb radiation of longer and shorter wavelengths. The present invention avoids the problems described by significantly reducing the out-of-band radiation emitted, and in one embodiment, use of an out-of-band filter may be eliminated entirely, as shown in FIG. 2.

As a result of implementing a laser beam formatting module corresponding to an exemplary embodiment of the present invention, a semiconductor wafer having one or more semiconductor dies may be fabricated. In a subsequent step, the semiconductor dies can be separated from the semiconductor wafer in a dicing process after wafer fabrication has been completed. The fabricated and separated semiconductor die, which is fabricated by using the present invention's laser beam formatting module, can be a microprocessor die, for example. The diced and separate dies can be packaged, i.e. can be enclosed and/or sealed in suitable semiconductor packages, as known in the art.

Figure 5:
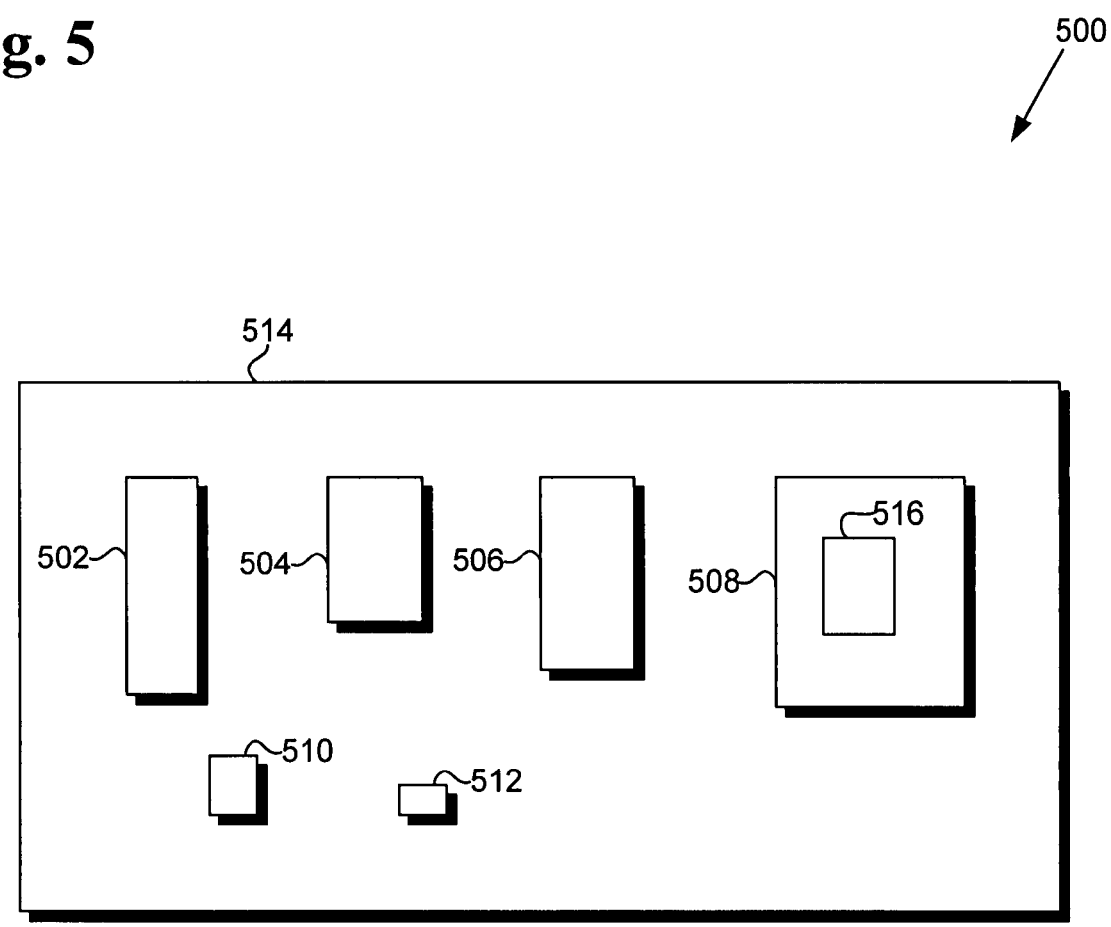
FIG. 5 is a diagram of an exemplary electronic system including an exemplary chip or die fabricated using a laser beam formatting module in a lithographic system, in accordance with one embodiment of the present invention.

FIG. 5 illustrates a diagram of an exemplary electronic system including an exemplary chip or die fabricated using a laser beam formatting module in accordance with one or more embodiments of the present invention. Electronic system 500 includes exemplary modules 502, 504, and 506, IC chip 508, discrete components 510 and 512, residing in and interconnected through circuit board 514. In one embodiment, electronic system 500 may include more than one circuit board. IC chip 508 can comprise a semiconductor die, such as semiconductor die 328, which is fabricated by using an embodiment of the invention's laser beam formatting module. IC chip 508 includes circuit 516, which can be a microprocessor, for example.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is mounted on circuit board 514 and can comprise, for example, any semiconductor die that is fabricated by utilizing an embodiment of the invention's laser beam formatting module. In one embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

As described above, the present invention's laser beam formatting module advantageously improves the conversion efficiency of laser beam energy into emission of patterning radiation in a laser excited plasma emission process. Use of the present invention also results in significantly reduced emission of out-of-band radiation, and avoidance of its attendant disadvantages. Moreover, implementation of the present invention in a lithographic system for the fabrication of semiconductor wafers may improve image quality, protect fragile reflective optics from undesirable heating, and eliminate the need for an out-of-band radiation filter.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a laser beam formatting module and method for fabricating semiconductor dies using same have been described.

The invention claimed is:

1. A laser beam formatting module for use in a lithographic system to fabricate a semiconductor wafer, said laser beam formatting module producing a substantially uniform laser beam intensity across a target and substantially zero laser beam intensity beyond edges of said target during fabrication of said semiconductor wafer, said laser beam formatting module comprising a lens assembly in a light path between an optical element and said target, wherein said laser beam formatting module substantially eliminates a need for an out-of-band filter on a radiation emission from said target.

2. The laser beam formatting module of claim 1 wherein said optical element is a diffractive optical element.

3. The laser beam formatting module of claim 1 wherein said optical element is an aperture plate.

4. The laser beam formatting module of claim 3 wherein said aperture plate comprises a substantially circular aperture.

5. A semiconductor die on said semiconductor wafer fabricated by the laser beam formatting module of claim 1.

6. The semiconductor die of claim 5 wherein said semiconductor die is utilized in a circuit board.

7. The semiconductor die of claim 5 wherein said semiconductor die is enclosed in a package.

8. The semiconductor die of claim 5 wherein said semiconductor die is utilized in a circuit board as a part of an electronic system, and said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

9. The laser beam formatting module of claim 1 wherein said lithographic system performs extreme ultraviolet (EUV) lithography.

10. The laser beam formatting module of claim 1 wherein said target comprises a salt solution doped with tin (Sn).

11. The laser beam formatting module of claim 1 wherein said target has a diameter less than or approximately equal to five hundred microns.

12. The laser beam formatting module of claim 1 wherein said lithographic system utilizes a laser-produced plasma (LPP) light source.

13. The laser beam formatting module of claim 1 wherein said lens assembly causes a laser beam to have a cross-sectional diameter greater than or approximately equal to a diameter of said target.

14. A method for fabricating a semiconductor wafer using a laser beam formatting module in a lithographic system, said method comprising:

placing a laser beam formatting module between a laser source and a target, said laser beam formatting module comprising an optical element and a lens assembly;

shining a laser beam from said laser source through said laser beam formatting module onto said target;

creating a substantially uniform laser beam intensity at said target and substantially zero laser beam intensity beyond edges of said target to produce a high resolution pattern for fabrication of said semiconductor wafer, wherein said laser beam formatting module substantially eliminates a need for an out-of-band filter on a radiation emission from said target.

15. The method of claim 14 wherein said optical element is a diffractive optical element.

16. The method of claim 14 wherein said optical element is an aperture plate.

17. The method of claim 14 further comprising dicing said semiconductor wafer into a plurality of semiconductor dies.

18. The method of claim 17 further comprising utilizing one or more of said plurality of semiconductor dies in a circuit board.

19. The method of claim 14 wherein said lithographic system performs extreme ultraviolet (EUV) lithography.

20. The method of claim 14 wherein said target comprises a salt solution doped with tin (Sn).

* * * * *